United States Patent
Ruppert

(10) Patent No.: US 12,342,510 B2
(45) Date of Patent: Jun. 24, 2025

(54) ELECTRICAL SWITCHING DEVICE, ELECTRICAL DRIVE LAYOUT AND MOTOR VEHICLE

(71) Applicant: AUDI AG, Ingolstadt (DE)

(72) Inventor: Daniel Ruppert, Lenting (DE)

(73) Assignee: Audi AG, Ingolstadt (DE)

( * ) Notice: Subject to any disclaimer, the term of this patent is extended or adjusted under 35 U.S.C. 154(b) by 131 days.

(21) Appl. No.: 18/169,047

(22) Filed: Feb. 14, 2023

(65) Prior Publication Data

US 2023/0262945 A1 Aug. 17, 2023

(30) Foreign Application Priority Data

Feb. 15, 2022 (DE) .......................... 102022103473.9

(51) Int. Cl.
 *H05K 7/20* (2006.01)
 *H02P 27/05* (2006.01)

(52) U.S. Cl.
 CPC ........... *H05K 7/2089* (2013.01); *H02P 27/05* (2013.01); *H02P 2207/05* (2013.01)

(58) Field of Classification Search
 CPC ........ B60L 15/007; B60L 1/003; B60L 3/003; H02P 27/05; H02P 2101/45; H02P 2207/05; H05K 7/2089; H05K 7/20927
 USPC ........................................................ 318/700
 See application file for complete search history.

(56) References Cited

U.S. PATENT DOCUMENTS

| | | | |
|---|---|---|---|
| 10,924,001 B2* | 2/2021 | Li ................. | H02M 5/4585 |
| 2013/0116871 A1* | 5/2013 | Hashimoto ............. | B60L 50/51 |
| | | | 903/903 |
| 2014/0036418 A1* | 2/2014 | Eichler .................. | H02B 13/02 |
| | | | 361/605 |
| 2017/0355267 A1* | 12/2017 | Zhou ..................... | B60L 50/10 |
| 2018/0079315 A1* | 3/2018 | Yang ................... | H02M 7/5387 |
| 2018/0342945 A1 | 11/2018 | Lange et al. | |
| 2022/0105793 A1 | 4/2022 | Sukhatankar et al. | |
| 2022/0385206 A1* | 12/2022 | Sakai .................... | H02P 29/027 |

FOREIGN PATENT DOCUMENTS

| | | |
|---|---|---|
| DE | 102012218604 A1 | 4/2014 |
| DE | 102017121579 A1 | 3/2018 |
| DE | 102018201321 A1 | 8/2019 |
| DE | 102019132685 A1 | 6/2021 |
| EP | 2556982 A1 | 2/2013 |

* cited by examiner

*Primary Examiner* — Gabriel Agared
(74) *Attorney, Agent, or Firm* — Seed IP Law Group LLP

(57) ABSTRACT

An electrical switching device for operating an electrical machine comprises an inverter circuit, an exciter circuit and a cooling device, wherein the exciter circuit is formed by at least one circuit module, wherein the circuit module is thermally coupled to the cooling device and comprises a discharge circuit, connected to the inverter circuit and adapted to discharge at least one energy accumulator of the inverter circuit.

10 Claims, 3 Drawing Sheets

ELECTRICAL SWITCHING DEVICE, ELECTRICAL DRIVE LAYOUT AND MOTOR VEHICLE

BACKGROUND

Technical Field

Embodiments of the invention relate to an electrical switching device for operating an electrical machine. Furthermore, embodiments of the invention relate to an electrical drive device as well as a motor vehicle.

Description of the Related Art

Hybrid motor vehicles and motor vehicles with purely electrical drive generally comprise a high-voltage onboard network, by which various power electronic components of the motor vehicle are supplied. These power electronic components can be, for example, a drive inverter, a DC voltage converter for converting the voltage of the high-voltage onboard network into a lower voltage, an onboard charging device of the motor vehicle, an electrical air conditioning compressor and/or an electrical heater. These components are supplied via the high-voltage onboard network from a high-voltage energy accumulator of the motor vehicle, such as a traction battery. The DC voltage in the high-voltage onboard network is between 350 V and 860 V, for example, in electric vehicles.

For reasons of safe use and functional security, a circuit for active discharging must be provided in every component of the high-voltage onboard network, comprising a high-voltage intermediate circuit capacitor or an X-capacitor for filtering of electromagnetic interference, since the voltage level of these capacitors can basically correspond to the voltage of the high-voltage onboard network. Thanks to such an active discharging circuit, the capacitor can be discharged, for example when the high-voltage onboard network of the motor vehicle is taken out of operation or when a fault occurs making it necessary to switch off the high-voltage onboard network.

The active discharging circuit generally consists of a switch, such as a transistor, as well as an ohmic resistance, by which the electrical energy stored in the capacitor is converted into heat during the discharging. This reduces the potential on the intermediate circuit capacitor, so that it can be lowered within a short period of time, especially within a given discharge time, to a level without any danger of a shock, for example, or to a minimum voltage level which should be reached.

The resistors used for the discharging, on account of the high intermediate circuit voltage occurring in a motor vehicle onboard network and the high discharge power needed to achieve the given discharge time, are generally designed very massive or robust, in order to withstand the possibly high thermal load during the discharge. This means that the resistors which can be used for the discharging are generally rather large and thus may take up considerable design space. This also applies in particular to circuit arrangements which are meant to discharge an energy accumulator in a circuit for the operation of an electrical machine. Various circuit arrangements are known for this in the prior art.

DE 10 2018 201 321 A1 describes a method for operating an arrangement consisting of an electrical machine and a rectifier. A potential imposed on an intermediate circuit capacitance is characterized by a monitored variable, and when the monitored variable goes beyond a given threshold value electrical energy is transferred from the intermediate circuit to at least one load resistor present in the layout, in order to reduce the monitored variable or the potential imposed at the intermediate circuit capacitance.

EP 2 556 982 A1 describes a discharge device for discharging a main capacitor in an electrical power circuit. The discharge circuit comprises, besides a discharge transistor, also a resistor, which serves for converting the electrical energy being discharged into heat.

From DE 10 2012 218 604 A1 there are known a circuit arrangement for discharging an electrical energy accumulator and a rectifier having such a circuit arrangement. The discharge circuit and further components on which a high potential is imposed are integrated monolithically in a circuit module.

BRIEF SUMMARY

Some embodiments include an electrical switching device for operating an electrical machine comprising an inverter circuit, an exciter circuit and a cooling device, wherein the exciter circuit is formed by at least one circuit module and the circuit module is thermally coupled to the cooling device.

Some embodiments provide an improved electrical switching device, making possible in particular a better capability of discharging an energy accumulator of an inverter circuit of the electrical switching device.

In an electrical switching device of the kind mentioned above, the circuit module may comprise a discharge circuit, connected to the inverter circuit and adapted to discharge at least one energy accumulator of the inverter circuit.

The electrical switching device serves in particular for operating an electrical machine. For this, the inverter circuit can be connected for example to a stator of the electrical machine and the exciter circuit of the electrical switching device can be connected for example to a rotor of the electrical machine. In this way, an externally excited electrical machine can be operated in particular by means of the electrical switching device.

The exciter circuit is thermally coupled to the cooling device of the electrical switching device in order to limit its heating, so that heat produced during the operation of the exciter circuit can be taken away through the cooling device. The inverter circuit can also be thermally coupled to the cooling device, so that the heat produced during the operation of the inverter circuit can also be taken away through the cooling device. The exciter circuit is formed by at least one circuit module, and the circuit module can be in direct thermal contact with the cooling device for the thermal coupling, for example. A connection of the circuit module by at least one thermal conductive medium, such as a thermal conduction paste, a thermal conduction pad, or the like, is also possible.

Besides the components needed to realize the exciter circuit, the circuit module comprises the discharge circuit, by which at least one energy accumulator of the inverter circuit can be discharged. On account of the thermal connection of the circuit module to the cooling device, there may also be a thermal connection of the discharge circuit to the cooling device. In this way, therefore, an especially active cooling of the components of the discharge circuit can occur through the cooling device, so that the discharge circuit or its components may be subjected to only a reduced heating during a discharge process. In other words, an efficient cooling of the discharge circuit can thus be achieved thanks to the integration of the discharge circuit in the circuit module of the exciter circuit, coupled to the cooling device.

As compared to traditional discharge circuits which are realized for example with discrete components on separate circuit boards and therefore need to be cooled for example by free convection of air, a better cooling of the discharge circuit can be achieved. In particular, since in the case of an electrical switching device comprising an inverter circuit a cooling can generally occur only through air with the comparatively high ambient temperature inside a power electronic unit, a significant improvement in the cooling of the discharge circuit is thus achieved.

The connection of the discharge circuit to the cooling device furthermore has the advantage that a heating of the discharge circuit can even be minimized during repeated discharge processes in direct succession, where a considerable amount of electrical energy is converted into heat within a brief span of time, so that in particular the robustness and the service life of the discharge circuit and thus also that of the overall electrical switching device can be improved.

By connecting the discharge circuit to the cooling device it may also be possible to reduce the size and/or the number of discharge resistors in the discharge circuit that are used for the discharging. In this way, high material and fabrication costs for the discharge resistors can be avoided. In particular, it becomes possible to use only a single, relatively small-sized discharge resistor in the discharge circuit for the discharging. With a reduced number of discharge resistors, the number of triggering semiconductors needed to switch the discharge resistors can also be reduced, which furthermore has advantageous impact on the cost expenditure for the material and for the fabrication of the discharge circuit.

The providing of a circuit module comprising a discharge circuit in addition to the exciter circuit also reduces the cost expenditure during the fabrication and assembly of the electrical switching device. The surface mounting on a circuit board and/or the screwing on of one or more discharge resistors, for example in a housing of the electrical switching device, may no longer be necessary, so that the costs for the construction and the connection techniques, especially for the mechanical and/or electrical connection of the discharge resistors, can be reduced.

Thanks to the cooling connection of the discharge circuit to the cooling device of the electrical switching device, it is also possible to avoid an over dimensioning of the discharge circuit or its components due to a poor cooling connection. Thus, the discharge circuit can be significantly reduced in size and thus be optimized in terms of its design space requirement, especially since the use of smaller discharge resistors is possible.

Besides a reduced integration expense for discharge resistors of the charging circuit, only a rather small thermal mass of the discharge circuit or its components is also required on account of the active cooling of the discharge circuit. Thus, on the whole, the design space requirement or the size of the discharge circuit and therefore also that of the electrical Switching device can be reduced.

A lesser heating of the discharge circuit furthermore means that the heat input from the discharge circuit or its components in other electrical components of the switching device, such as the exciter circuit and/or the inverter circuit, can be reduced. This can have an especially advantageous impact on the expected service life of the electrical components of the electrical switching device.

Given an adequate cooling of the discharge circuit, there is furthermore no need for a temperature measurement to monitor the discharge circuit or its discharge resistors. This furthermore has the benefit that neither are filtering and/or noise immunity procedures needed any longer for the temperature measurement.

In some embodiments, the discharge circuit comprises at least one switch element and at least one discharge resistor and/or the exciter circuit comprises at least one full bridge or at least two series circuits each formed from at least one switch element and at least one diode.

The discharge circuit can comprise in particular one or more series circuits composed of one switch element and one discharge resistor. These series circuits can be hooked up in particular in parallel with the energy accumulator being discharged, so that when the switch element is closed the energy accumulator being discharged is short-circuited across the switch element and the discharge resistor. Besides the use of a single discharge resistor, the discharge circuit can also comprise a series circuit and/or a parallel circuit of multiple discharge resistors, which can be hooked up across one or more switch elements, especially in parallel with the energy accumulator being discharged.

The exciter circuit can comprise in particular a full bridge or at least two series circuits each composed of at least one switch element and at least one diode. A portion of the circuit being energized, such as the rotor winding of an externally excited electrical machine, can then be switched into the branch of the bridge of the switch elements and diodes hooked up as a quasi-half bridge, for example.

In some embodiments, the circuit module comprises a circuit board, on which the discharge circuit and the exciter circuit are formed, and/or the circuit module comprises a housing, inside which the discharge circuit and the exciter circuit are arranged, and/or the circuit module is or comprises a semiconductor component, which forms the discharge circuit and/or the exciter circuit.

The circuit module can comprise a circuit board, on which the modules are arranged to form the discharge circuit and the exciter circuit. In addition or alternatively, the circuit module can comprise a housing, which encases the discharge circuit and the exciter circuit. It is also possible for the circuit module to be designed as a semiconductor component or to comprise a semiconductor component, by which the discharge circuit and the exciter circuit are formed.

The circuit module can comprise a cooling surface, which can be formed for example on one side of a circuit board or one side of a housing and/or a semiconductor component. Through this cooling surface, the circuit module can be thermally connected to the cooling device, for example by using a thermal conductive intermediate layer such as a thermal conduction paste, a thermal conduction pad, or the like. In this way, heat produced in the circuit module during the operation of the exciter circuit or during the operation of the discharge circuit can be taken away from the circuit module and thus in particular also from the components of the discharge circuit.

In some embodiments, the cooling device is formed as a cooling body, especially one with a cooling agent flowing through it. The cooling device for example can have one or more ports by which a cooling duct formed inside the cooling device can be connected to a cooling circuit. The cooling device can consist of metal, for example, and have one or more side surfaces on which the components of the electrical switching device being cooled, such as the circuit module, are arranged.

In some embodiments, the inverter circuit comprises at least one power module, the power module being thermally coupled to the cooling device. The power module of the inverter circuit can be designed, for example, as a half bridge module, and the inverter circuit can comprise several such half bridge modules, for example three half bridge modules, to form a single or multiple-phase inverter, such as a three-phase inverter. Like the circuit module, the at least one power module of the inverter circuit can also be thermally coupled to the cooling device, so that heat arising during operation of the inverter circuit can also be surrendered to the cooling device.

In some embodiments, the at least one power module and the circuit module are arranged next to each other on a cooling surface of the cooling device. In the case of an inverter circuit having multiple power modules, the multiple power modules as well as the circuit module can be arranged in a row on one cooling surface of the cooling device, for example. In this way, a compact and robust design of the electrical switching device is achieved.

In some embodiments, the energy accumulator of the inverter circuit is a capacitor. The capacitor can comprise, for example, a capacitor in a DC voltage intermediate circuit of the inverter circuit or a so-called intermediate circuit capacitor. In particular, the capacitor can be arranged as an X-capacitor in the inverter circuit. For the discharging of the capacitor, the discharge circuit can be hooked up in parallel with the capacitor, so that electrical energy stored in the capacitor can be converted into heat via the discharge circuit. The inverter circuit can comprise in particular several such capacitors, especially being hooked up in parallel with each other, as an energy accumulator which can be discharged across the discharge circuit.

For an electrical drive layout as described herein it is provided that it comprises an electrical machine as well as an electrical switching device as described herein, wherein a stator winding of the electrical machine is connected to the inverter circuit and a rotor winding of the electrical machine is connected to the exciter circuit.

The electrical machine is designed in particular as an externally excited electrical machine, such as an externally excited synchronous machine. By means of the inverter circuit of the electrical switching device, the stator winding of the electrical machine can be energized, and by means of the exciter circuit the rotor winding of the electrical machine can be energized accordingly. In this way, the electrical machine can be operated by the electrical switching device in a motor mode. Moreover, it is possible to convert an alternating current generated by the electrical machine into a direct current by means of the inverter circuit in a generator mode of the electrical machine.

For a motor vehicle as described herein, it is provided that it comprises at least one electrical drive layout as described herein.

In some embodiments, the electrical machine of the electrical drive layout is an electrical traction motor of the motor vehicle. It is possible for the motor vehicle to have two or more electrical drive layouts, the electrical machines of which each form an electrical traction motor of the motor vehicle, in particular.

All of the benefits and embodiments described above in regard to the electrical switching device also hold accordingly for the electrical drive layout and the motor vehicle, and vice versa.

Furthermore, all the benefits and embodiments which have been described in regard to the motor vehicle also apply accordingly to the electrical drive layout and the electrical switching device, and vice versa.

BRIEF DESCRIPTION OF THE SEVERAL VIEWS OF THE DRAWINGS

Further benefits and details will emerge from the following described embodiments and the drawings.

DETAILED DESCRIPTION

Figure 1:
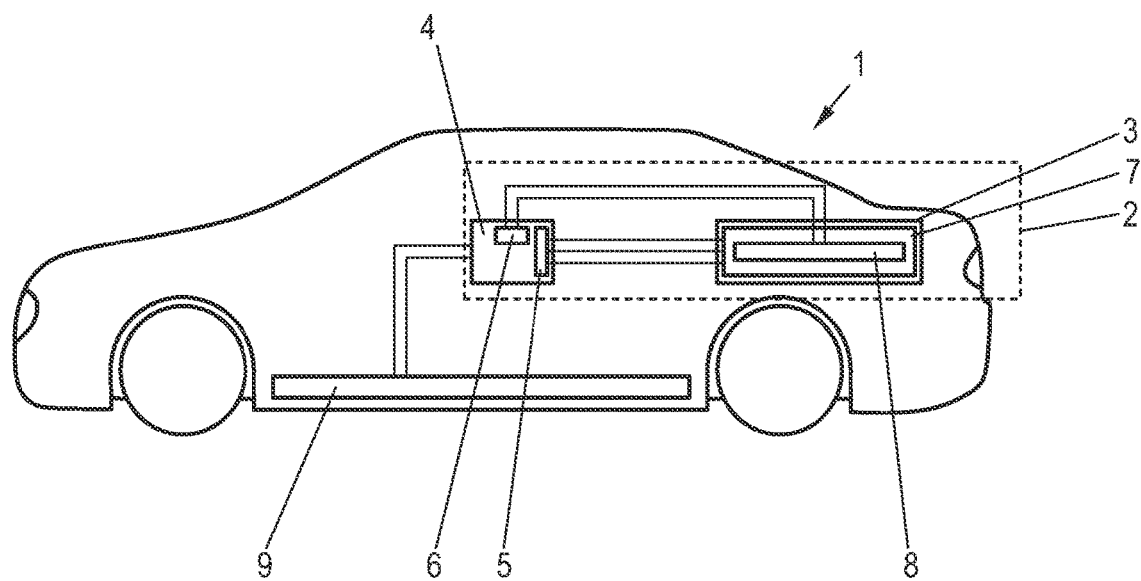
FIG. 1 shows an embodiment of a motor vehicle comprising an embodiment of an electrical drive layout.

FIG. 1 shows an embodiment of a motor vehicle 1. The motor vehicle 1 comprises an electrical drive layout 2, which comprises an electrical machine 3 and an electrical switching device 4. The electrical machine 3 is designed as an externally excited synchronous machine, for example, and it forms an electric traction motor of the motor vehicle 1.

The electrical switching device 4 serves for operating the electrical machine 3 and it comprises for this purpose an inverter circuit 5 and an exciter circuit 6. The inverter circuit 5 is connected to a stator winding 7 of a stator of the electrical machine 3. In the present case, the stator winding 7 can be three-phase, for example, and be energized by an inverter circuit 5 forming or comprising a three-phase inverter.

The exciter circuit 6 of the electrical switching device 4 is connected to a rotor winding 8 of a rotor of the electrical machine 3. In this way, the rotor winding 8 can be energized through the electrical switching device 4 or the exciter circuit 6. The electrical switching device 4, especially the inverter circuit 5 and the exciter circuit 6, are connected to an energy accumulator 9 of the motor vehicle 1. By means of the energy accumulator 9, which is designed for example as a traction battery of the motor vehicle 1, a direct current can be provided, which is converted by the inverter circuit 5 into a three-phase alternating current (in the present instance) for energizing the stator 7.

Using the exciter circuit 6, the direct current taken from the energy accumulator 9 can be used to energize the rotor 8, so that the electrical machine 3 can be operated in a motor mode. Furthermore, it is possible to use the electrical switching device 4, especially the inverter circuit 5, to also transform an alternating current generated by the electrical machine 3 in a generator mode into a direct current and to use it for example to charge the energy accumulator 9.

Figure 2:
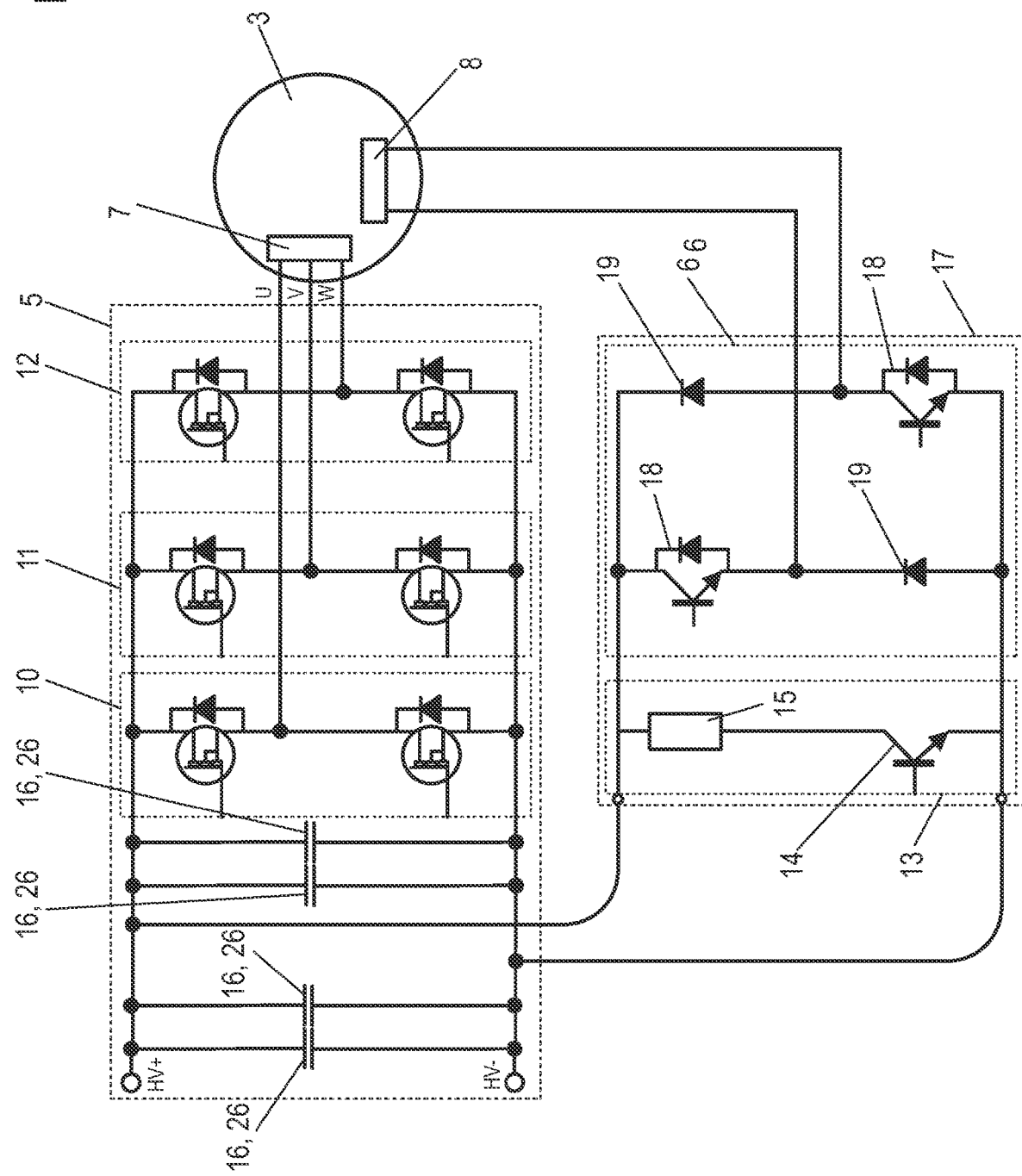
FIG. 2 shows a circuit diagram of an embodiment of an electrical switching device.

FIG. 2 shows a circuit diagram of the electrical switching device 4. The inverter device 5 in the present case comprises an inverter designed as a three-phase B6 bridge rectifier, formed from three half bridges 10, 11, 12. The half bridges 10, 11, 12 can each be formed by an individual power module, for example.

The inverter circuit 5 is connected to the energy accumulator 9 by the terminals indicated as HV+ and HV−. A three-phase alternating current with phases U, V, W is generated by the inverter circuit 5 in a motor mode of the electrical machine 3, serving for the energization of the stator winding 7 of the electrical machine 3. The inverter circuit can furthermore comprise a driver circuit (not shown) and/or a control device (not shown) for activating the driver circuit and/or the half bridges 10, 11, 12.

The direct current side of the inverter circuit 5 is connected to the exciter circuit 6, which serves for energizing the rotor winding 8 of the electrical machine 3, and to a discharge circuit 13 of the electrical switching device 4. The discharge circuit 13 comprises a switch element 14 as well as a discharge resistor 15. The switch element 14 and the discharge resistor 15 are hooked up in series.

The series circuit of the switch element 14 and the discharge resistor 15 is hooked up in parallel with multiple energy accumulators 26 of the inverter circuit 5, designed as capacitors 16, so that the capacitors 16 can be discharged through the discharge circuit 13. The number of four capacitors 16 shown here is merely an example, and the inverter circuit 5 can also have a different number of capacitors 16. The capacitors 16 are each designed, for example, as an intermediate circuit capacitor or as an X-capacitor and are located for this purpose in a direct current portion of the network of the inverter circuit 5 or on the direct current side of the inverter formed by the half bridges 10, 11, 12.

In the present case, the discharge circuit 13 and the exciter circuit 6 are configured as a common circuit module 17. The exciter circuit 6, which comprises two series circuits each composed of a switch element 18 and a diode 19, is designed as a quasi-half bridge, so that through it a winding of the rotor 8 of the electrical machine 3 can be energized.

The onboard network of the motor vehicle 1, comprising the energy accumulator 9 and the electrical switching device 4, is in particular a high-voltage onboard network, which can have a high voltage between 350 V and 860 V, for example. Since the potential of the energy accumulator 9 is imposed accordingly at the terminals HV+ and HV− of the inverter circuit 5, this also falls across the capacitors 16, especially when they are fully charged.

Since such voltages are far above a permissible voltage level, such as a low touch-safe voltage below 60V, it is necessary to discharge the capacitors 16 at the end of the operation of the motor vehicle 1 or when a fault occurs through the discharge circuit 13. For this, the switch element 14 of the discharge circuit 13 can be closed, so that the capacitors 16 are each short-circuited across the discharge resistor 15 and thus discharged.

Figure 3:
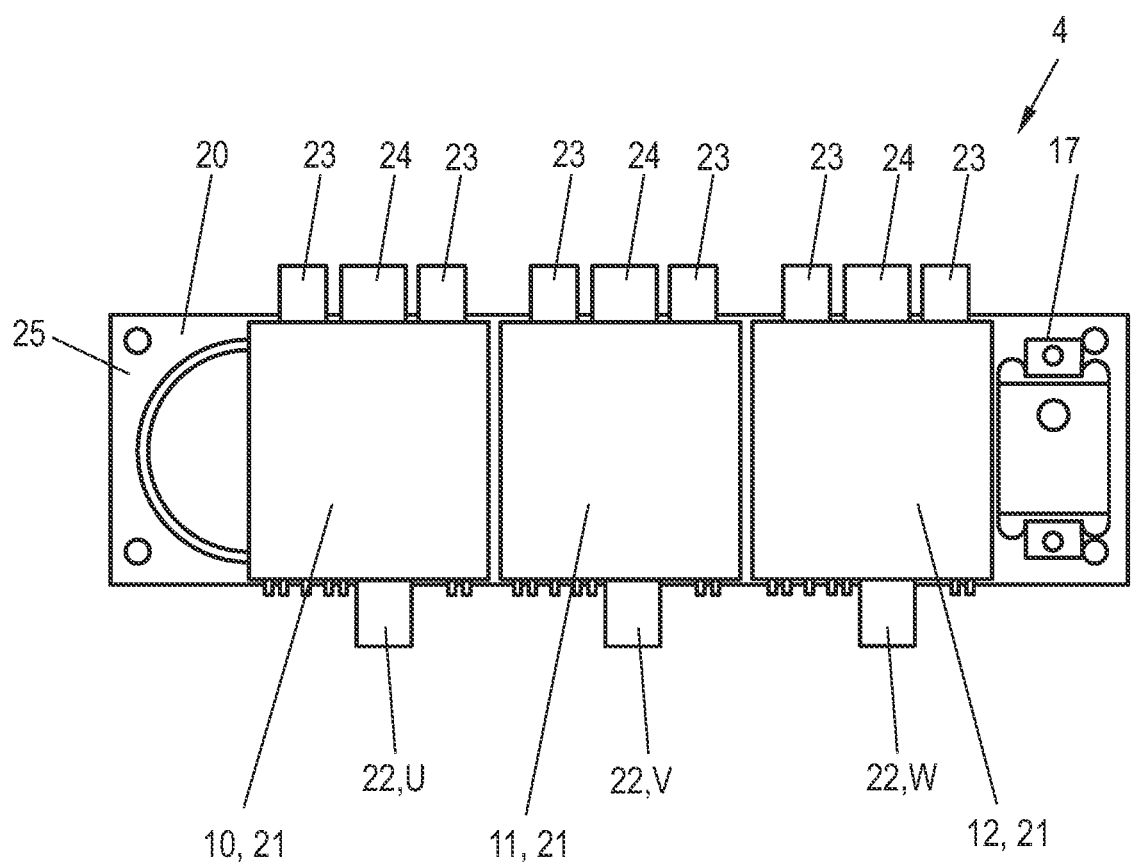
FIG. 3 shows a view of an electrical switching device.

FIG. 3 presents a view of the electrical switching device 4. The electrical switching device 4 comprises a cooling device 20, on which are arranged the circuit module 17 as well as three power modules 21, each forming one of the half bridges 10, 11, 12 of the inverter circuit 5. The power modules 21 each comprise a power terminal 22 for providing a phase U, V, W of the alternating current which can be generated by the inverter circuit 5. Furthermore, the power modules 21 comprise multiple power terminals 23, 24 by which in particular a DC+ and DC− terminal can be provided for connecting the power modules 21 to the capacitors 16.

The cooling device 20 of the electrical switching device 4 is designed as a cooling body, through which a cooling medium can flow. For this, the cooling device may comprise one or more cooling ducts (not shown), which extend in the interior and through which heat can be carried away from the cooling device 20 by means of a cooling medium.

The cooling device 20 can comprise one or more ports (not shown), by which the cooling ducts extending in its interior can be connected to a cooling circuit, especially a cooling circuit of the motor vehicle 1. In this way, an active cooling of the components arranged on the cooling device 20 can occur.

The cooling device 20 comprises a cooling surface 25, on which are arranged the power modules 22 and the circuit module 7, which forms the exciter circuit 6 and the discharge circuit 13. Thanks to the placement of the circuit module 17 directly on the cooling device 20, an efficient removal of heat from the discharge circuit 13 is made possible, especially from the discharge resistor 15 of the discharge circuit 13.

The power modules 21 as well as the circuit module 17 are thermally coupled to the cooling device 20. For this, the power modules 22 and the circuit module 17 can each have a cooling surface, for example, which is arranged in direct contact with the cooling surface 25 of the cooling device 20. It is possible for a thermal conduction medium to be arranged between the cooling surfaces of the circuit module 17 or the power modules 22 and the cooling surface 25 of the cooling device 20, such as a thermal conduction paste or a thermal conduction pad, in order to decrease the junction resistance and thus achieve a better removal of heat in the cooling device 20.

The circuit module 17 can comprise for example a circuit board, on which are formed the discharge circuit 13 and the exciter circuit 6. In addition or alternatively, the circuit module 17 can comprise a housing, inside which are arranged the discharge circuit 13 and the exciter circuit 6. In addition or alternatively, the circuit module 17 can be or comprise a semiconductor component, the discharge circuit 13 and the exciter circuit 6 being formed by the semiconductor component.

In any variants, the circuit module 17 can be thermally coupled to the cooling device 20, as described above, through a cooling surface, such as one side of the circuit board or one side of the housing and/or the semiconductor component, in order to bring about a removal of heat from the exciter circuit 6 and the discharge circuit 13. In particular, the discharge resistor 15 can be arranged or configured in the circuit module 17 such that the heat produced especially during the discharging of the capacitors 16 can be taken away directly through the cooling surface of the circuit module 17. It is possible to also discharge other energy accumulators 26 of the inverter circuit 5 through the discharge circuit 13, besides the capacitors 16.

German patent application no. 10 2022 103473.9, filed Feb. 15, 2022, to which this application claims priority, is hereby incorporated herein by reference in its entirety.

Aspects of the various embodiments described above can be combined to provide further embodiments. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. An electrical switching device for operating an electrical machine, comprising:
   an inverter circuit,
   an exciter circuit that, in operation, excites a rotor winding of the electrical machine, and
   a cooling device,
   wherein the exciter circuit is formed by at least one circuit module,
   wherein a stator winding of the electrical machine is connected to the inverter circuit and the rotor winding of the electrical machine is connected to the exciter circuit,
   wherein the at least one circuit module is thermally coupled to the cooling device and comprises a discharge circuit connected to the inverter circuit, and
   wherein the discharge circuit, in operation, discharges at least one energy accumulator of the inverter circuit.

2. The electrical switching device according to claim 1, wherein the discharge circuit comprises at least one switch element and at least one discharge resistor and/or the exciter circuit comprises at least one full bridge or at least two series circuits each formed from at least one switch element and at least one diode.

3. The electrical switching device according to claim 1, wherein the at least one circuit module comprises a circuit board, on which the discharge circuit and the exciter circuit are formed, and/or the at least one circuit module comprises a housing, inside which the discharge circuit and the exciter circuit are arranged, and/or the at least one circuit module is or comprises a semiconductor component, which forms the discharge circuit and the exciter circuit.

4. The electrical switching device according to claim 1, wherein the cooling device is formed as a cooling body, especially one with a cooling agent flowing through it.

5. The electrical switching device according to claim 1, wherein the inverter circuit comprises at least one power module, the power module being thermally coupled to the cooling device.

6. The electrical switching device according to claim 5, wherein the at least one power module and the at least one circuit module are arranged next to each other on a cooling surface of the cooling device.

7. The electrical switching device according to claim 1, wherein the energy accumulator of the inverter circuit is a capacitor.

8. An electrical drive layout comprising:
    an electrical machine; and
    an electrical switching device that includes:
        an inverter circuit,
        an exciter circuit that, in operation, excites a rotor winding of the electrical machine, and
        a cooling device,
    wherein the exciter circuit is formed by at least one circuit module,
    wherein the at least one circuit module is thermally coupled to the cooling device and comprises a discharge circuit connected to the inverter circuit,
    wherein the discharge circuit, in operation, discharges at least one energy accumulator of the inverter circuit, and
    wherein a stator winding of the electrical machine is connected to the inverter circuit and the rotor winding of the electrical machine is connected to the exciter circuit.

9. A motor vehicle comprising the electrical drive layout according to claim 8.

10. The motor vehicle according to claim 9, wherein the electrical machine of the electrical drive layout is an electrical traction motor of the motor vehicle.

* * * * *